United States Patent
Gipson

(10) Patent No.: US 9,072,202 B2
(45) Date of Patent: Jun. 30, 2015

(54) SYSTEMS AND METHODS FOR CLEANING FILTERS OF AN ELECTRICAL DEVICE

(75) Inventor: Kirk P. Gipson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1447 days.

(21) Appl. No.: 11/871,485

(22) Filed: Oct. 12, 2007

(65) Prior Publication Data

US 2009/0097202 A1    Apr. 16, 2009

(51) Int. Cl.
| | |
|---|---|
| H05K 7/20 | (2006.01) |
| B01D 46/00 | (2006.01) |
| B01D 46/46 | (2006.01) |
| F04D 29/70 | (2006.01) |
| G06F 1/20 | (2006.01) |

(52) U.S. Cl.
CPC ........ H05K 7/20836 (2013.01); B01D 46/0067 (2013.01); B01D 46/46 (2013.01); *B01D 2279/45* (2013.01); F04D 29/701 (2013.01); H05K 7/20181 (2013.01)

(58) Field of Classification Search
USPC ........................................................ 361/695
See application file for complete search history.

(56) References Cited

U.S. PATENT DOCUMENTS

| | | | | |
|---|---|---|---|---|
| 4,751,872 A | * | 6/1988 | Lawson, Jr. | 454/184 |
| 4,773,310 A | * | 9/1988 | Corwin | 454/244 |
| 4,792,344 A | * | 12/1988 | Belcher et al. | 95/282 |
| 5,934,368 A | * | 8/1999 | Tanaka et al. | 165/233 |
| 6,105,875 A | * | 8/2000 | LaGrotta et al. | 236/44 A |
| 6,401,463 B1 | * | 6/2002 | Dukhan et al. | 62/5 |
| 6,532,151 B2 | * | 3/2003 | Osecky et al. | 361/679.48 |
| 6,552,900 B1 | * | 4/2003 | Hoefer et al. | 361/695 |
| 6,840,974 B2 | * | 1/2005 | Bailey | 55/385.6 |
| 6,885,554 B1 | * | 4/2005 | Reeck et al. | 361/695 |
| 7,180,738 B2 | * | 2/2007 | Mandel et al. | 361/695 |
| 7,419,534 B2 | * | 9/2008 | Hirano | 96/111 |
| 7,571,617 B2 | * | 8/2009 | Inoue et al. | 62/157 |
| 2002/0015287 A1 | * | 2/2002 | Shao | 361/695 |
| 2002/0036886 A1 | * | 3/2002 | Negishi | 361/645 |
| 2002/0101714 A1 | * | 8/2002 | Osecky et al. | 361/687 |
| 2003/0094263 A1 | * | 5/2003 | Garcia et al. | 165/80.2 |
| 2004/0151583 A1 | * | 8/2004 | Bettencourt et al. | 416/1 |
| 2005/0108996 A1 | * | 5/2005 | Latham et al. | 55/385.2 |
| 2006/0097675 A1 | * | 5/2006 | Hsu | 318/280 |
| 2007/0207721 A1 | * | 9/2007 | Chang | 454/184 |
| 2007/0251381 A1 | * | 11/2007 | Latham et al. | 95/23 |
| 2009/0016019 A1 | * | 1/2009 | Bandholz et al. | 361/695 |

* cited by examiner

*Primary Examiner* — Michail V Datskovskiy
(74) *Attorney, Agent, or Firm* — David R Risley

(57) ABSTRACT

In one embodiment, a filter cleaning system and method pertain to, during a filter cleaning operation, reversing a flow direction of an inlet fan associated with a filter of the electrical device, the inlet fan being adapted to force air into a housing of the electrical device during normal operation of the electrical device, and reversing a flow direction of an outlet fan adapted to draw air out from the electrical device housing during normal operation of the electrical device so as to increase pressure within the electrical device housing during the filter cleaning operation, wherein the combined action of the reversed inlet fan and the reversed outlet fan purges particulate matter from the filter.

11 Claims, 5 Drawing Sheets

SYSTEMS AND METHODS FOR CLEANING FILTERS OF AN ELECTRICAL DEVICE

BACKGROUND

Electrical devices, such as computers and networking equipment, often comprise fans that are used to cool the heat-generating components provided within the devices, such as processors, storage devices, and the like. It is not unusual for air filters to be placed adjacent inlet fans, i.e., fans that draw air into the device, to prevent particulate matter from entering the electrical device enclosure.

From time to time, such filters can become clogged by the particulate matter that they are designed to impede. In such cases, it can be more difficult for an inlet fan adjacent the filter to draw cooling air into the electrical device enclosure, which can ultimately result in overheating and damage of components with the enclosure.

BRIEF DESCRIPTION OF THE DRAWINGS

The disclosed systems and methods can be better understood with reference to the following drawings. The components in the drawings are not necessarily to scale.

DETAILED DESCRIPTION

Disclosed herein are systems and methods for cleaning a filter associated with an electrical device fan. In some embodiments, the flow direction of the fan as well as the flow directions of one or more other fans of the electrical device are reversed so as to generate relatively high pressure within the electrical device that is effective in removing particulate matter from the filter. In some embodiments, each fan of the electrical device that is associated with a filter can be sequentially cleaned in the same manner on a regular periodic basis.

Figure 1:
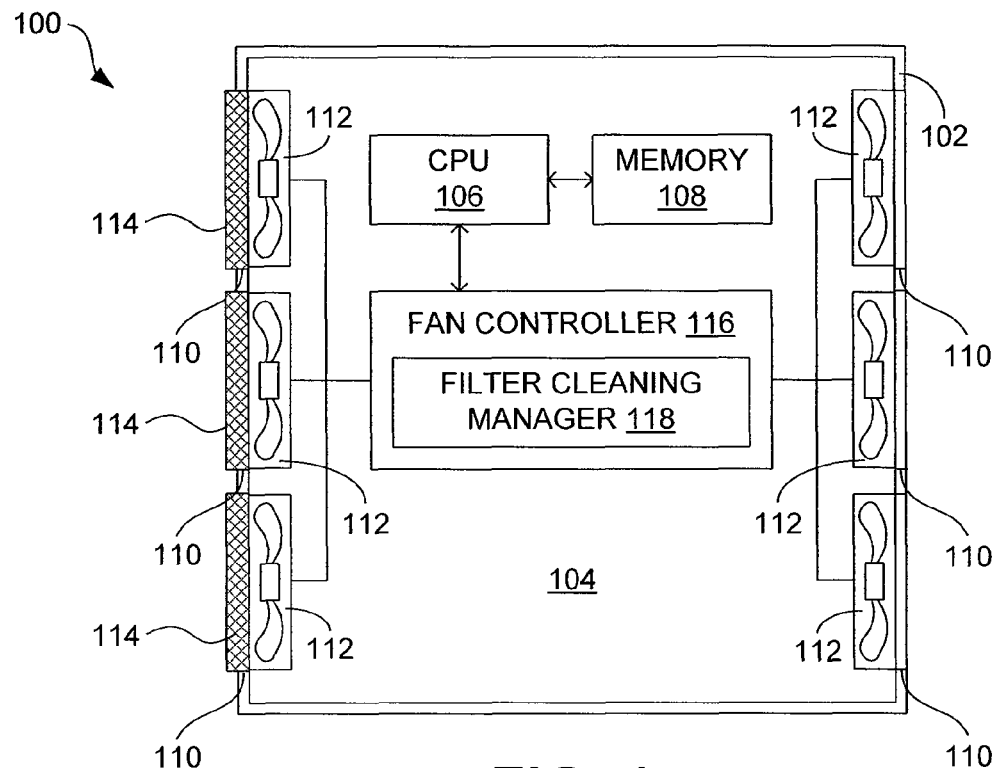
FIG. 1 is a schematic view of an embodiment of an electrical device that includes cooling fans, some of which being associated with filters.

Referring now to the drawings, in which like numerals identify corresponding parts throughout the several views, FIG. 1 illustrates an embodiment of an electrical device 100. Generally speaking, the electrical device 100 comprises an electronic device that manipulates data in some way. By way of example, the electrical device 100 comprises a mainframe computer, a server computer, a personal computer, a data storage unit, a networking device, or other device that comprises internal heat-generating components that are to be cooled. In some embodiments, the electrical device 100 may be referred to as a computer device.

As indicated in FIG. 1, the electrical device 100 includes an outer housing 102 that defines an interior space 104 in which the various internal components of the device are contained. In the example embodiment shown in the figure, those internal components at least include a central processing unit (CPU) 106 and memory 108. Formed in the outer housing 102 are a plurality of ports 110 that enable air to flow into or out from the interior space 104.

Positioned at, for example adjacent or within, each of the ports 110 are fans 112 that assist in forcing air into or drawing air out from the interior space 104. In some embodiments, each fan 112 has a normal operating flow direction. For example, the fans 112 at the left end of the electrical device 100 (in the orientation of FIG. 1) can drive air in a direction in which air is forced into the interior space 104. In addition, the fans 112 on the right end of the electrical device 100 (in the orientation of FIG. 1) can drive air in a direction in which air is drawn out from the interior space 104. In such a situation, the fans 112 on the left end can be considered inflow or "inlet" fans and the fans on the right end can be considered outflow or "outlet" fans.

Positioned adjacent the inlet fans 112 are air filters 114. More particularly, the air filters 114 are provided adjacent an input side of the inlet fans 112 at which air is drawn into the fans during normal operation. Operating in that manner, the cooling air driven into the electrical device housing 102 is first filtered by the filters 114. Therefore, particulate matter, such as dust and other debris, is obstructed or trapped by the filters 114 before it can enter the interior space 104 and interfere with operation of the internal electrical of the computing device 100. By way of example, the filters can comprise foam air filters.

As is further indicated in FIG. 1, a fan controller 116 is provided within the interior space 104. As its name suggests, the fan controller 116 is configured to control operation of the fans 112. Such control includes controlling which fans 112 operate and which do not, controlling the operation speeds of the fans, and controlling the rotation directions of the fans. In some embodiments, the fan controller 116 operates under the control of the CPU 106 or another master control device. As shown in FIG. 1, the fan controller 116 includes a filter cleaning manager 118 that comprises logic, for example in the form of firmware, that regulates cleaning operation of the fans 112. Examples of such cleaning operation are described below. Notably, although the filter cleaning manager 118 has been depicted as comprising part of the fan controller 116, the manager or its functionality could be provided elsewhere within the electrical device 100, for example, within the CPU 106 and/or memory 108.

Various logic has been described above. That logic can be stored on any computer-readable medium for use by or in connection with any computer-related system or method. In the context of this disclosure, a computer-readable medium is an electronic, magnetic, optical, or other physical device or means that contains or stores a computer program or module for use by or in connection with a computer-related system or method. Logic, in the form of programs, routines, and algorithms can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

Figure 2:
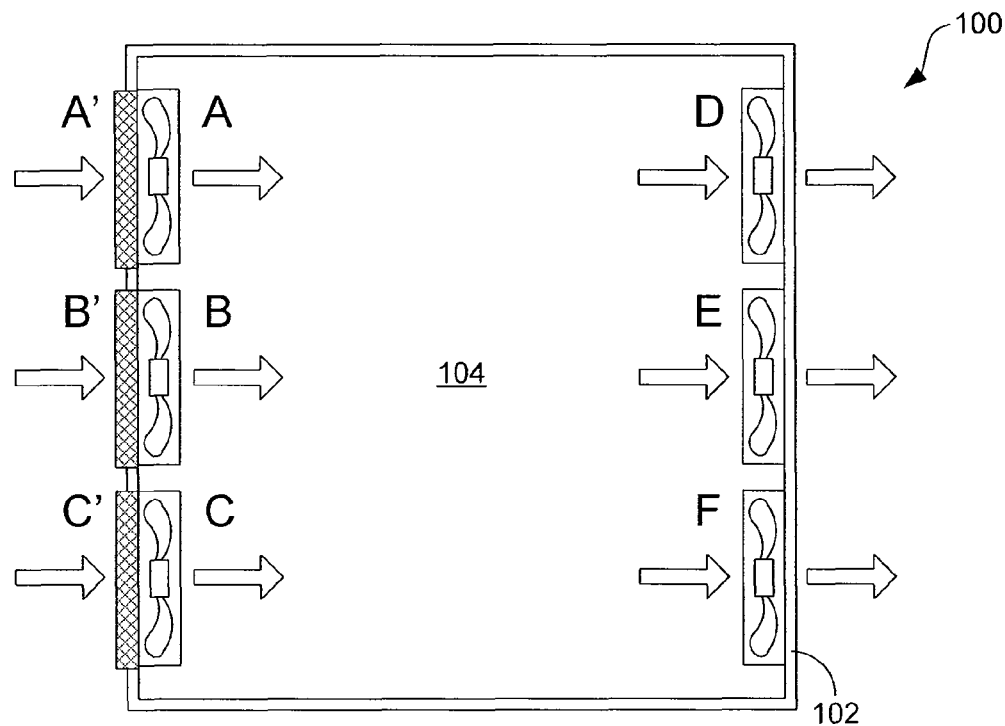
FIG. 2 is simplified view of the electrical device of FIG. 1, illustrating an embodiment of normal operation of the fans.

FIG. 2 illustrates an embodiment of normal operation of the fans 112 and, more particularly, typical airflow into and out from the electrical device housing 102. In keeping with the example configuration described above in relation to FIG. 1, the fans on the left end of the electrical device 100, i.e., fans A-C, are inlet fans and fans at the right end of the electrical device, i.e., fans D-F, are outlet fans. Therefore, fans A-C draw relatively cool air from outside of the housing 102 through the filters 114 and force the air into the interior space 104, while fans D-F draw relatively hot air from the interior space 104 out from the housing 102. Therefore, a general push-pull airflow is generated that, in the orientation of FIG. 1, moves from left to right.

When the fans 112 have been operated in the manner described above for a relatively long period of time, or when air of the environment in which the electrical device 100 contains a relatively large amount of particulate matter, a significant amount of particulate matter can collect on or in the filters 114 (filters A'-C' in FIG. 2). Such particulate matter can impede airflow through the filters 114, which, in turn, can limit the ability of the inlet fans A-C to drive cooling air into the housing 102. When that happens, the self-cooling capability of the electrical device 100 can become compromised, the temperature of the internal components of the device can rise, and operational failures or component damage can result. Accordingly, it is important to ensure that the filters 114 are intermittently cleaned or replaced. Although such cleaning or replacement is not difficult to achieve, human effort is required. That is, a human being must remember or be reminded to clean or replace the filters 114, and then that human being or another must in fact clean or replace the filters. This can result in the filters 114 not being cleaned or replaced. Filter cleaning can, however, be ensured when the electrical device 100 is configured to automatically clean or clear the filters 114 without human intervention.

Figure 3:
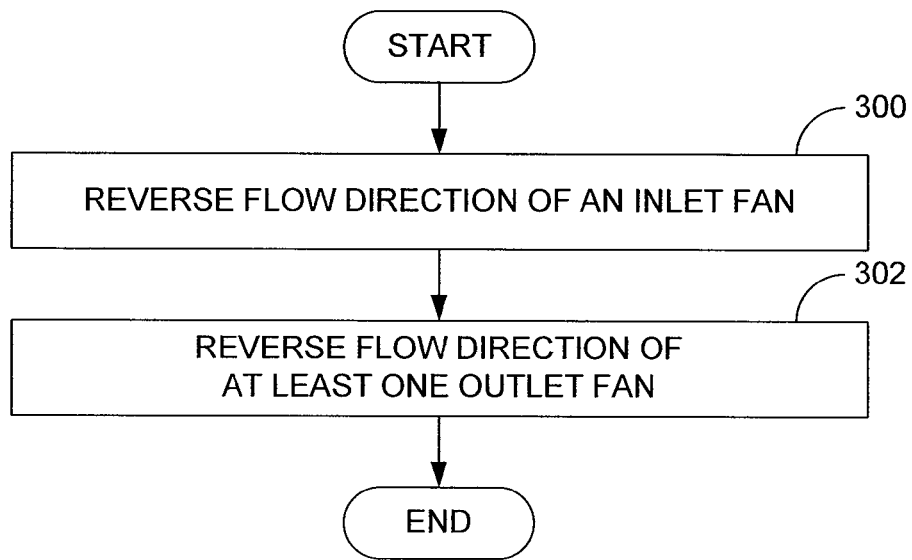
FIG. 3 is a flow diagram that illustrates a first embodiment of a method for cleaning a filter of an electrical device.

FIG. 3 illustrates an embodiment of a method for automatically cleaning an electrical device filter such that the human intervention described above is not necessary. Beginning with block 300, when it is determined that a filter associated with an inlet fan is to be cleaned, the flow direction of that inlet fan is reversed such that the inlet fan draws air out from the interior space of the electrical device, thereby, at least temporarily, operating as an outlet fan. Notably, the flow directions of the other inlet fans can be left at the normal operating flow direction such that they continue to force air into the interior space. At or around the same time, the flow direction of at least one outlet fan is reversed, as indicated in block 302, such that the outlet fan forces air into the interior space, thereby, at least temporarily, operating as an inlet fan. This can be done, for example, by reversing the polarity of the voltage applied to a fan motor (not shown) that drives the fan. In some embodiments, the flow direction of each outlet fan is so reversed. Through such operation, multiple fans of the computing device force air into the interior space of the computing device to create relatively high pressure within the interior space that assists the reversed inlet fan in purging collected particulate matter out from or off of its associated filter. Optionally, the air flow during filter cleaning can be enhanced by over driving the fan motors for one or more short bursts to clean debris from the filter.

Figure 4:
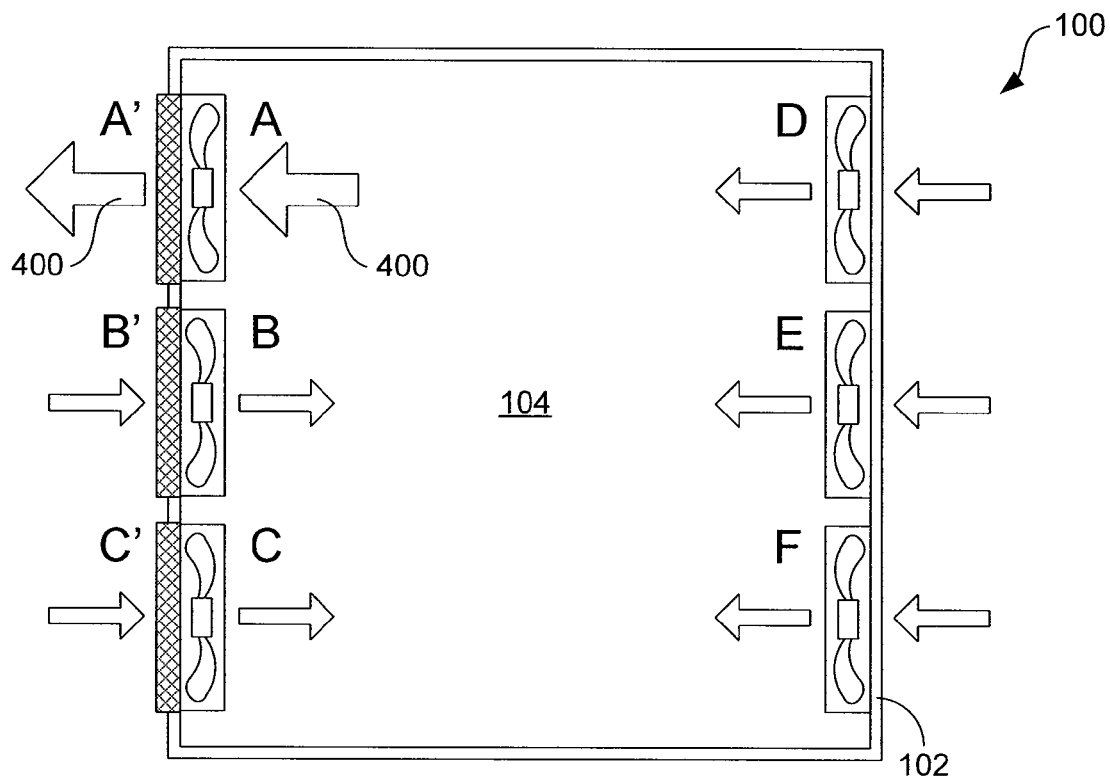
FIG. 4 is simplified view of the electrical device of FIG. 1, illustrating cleaning of a filter in the manner described in relation to FIG. 3.

Operation consistent with that described above in relation to FIG. 3 is illustrated in FIG. 4. As shown in FIG. 4, the flow direction of one of the inlet fans, specifically fan A, has been reversed as have the flow directions of each of the outlet fans D-F. The normal operating flow directions of fans B and C have been left unchanged. As a consequence, each of fans B-F force air into the interior space 104 of the computing device 100, causing air to be expelled with relatively high force from the interior space through fan A and, therefore, through filter A'. Significantly, air is passed through filter A' with much greater force or velocity (as indicated by large arrows 400) than if the flow direction of fan A alone were reversed. Consequently, particulate matter collected by the filter 114 can be removed more effectively.

Figure 5A:
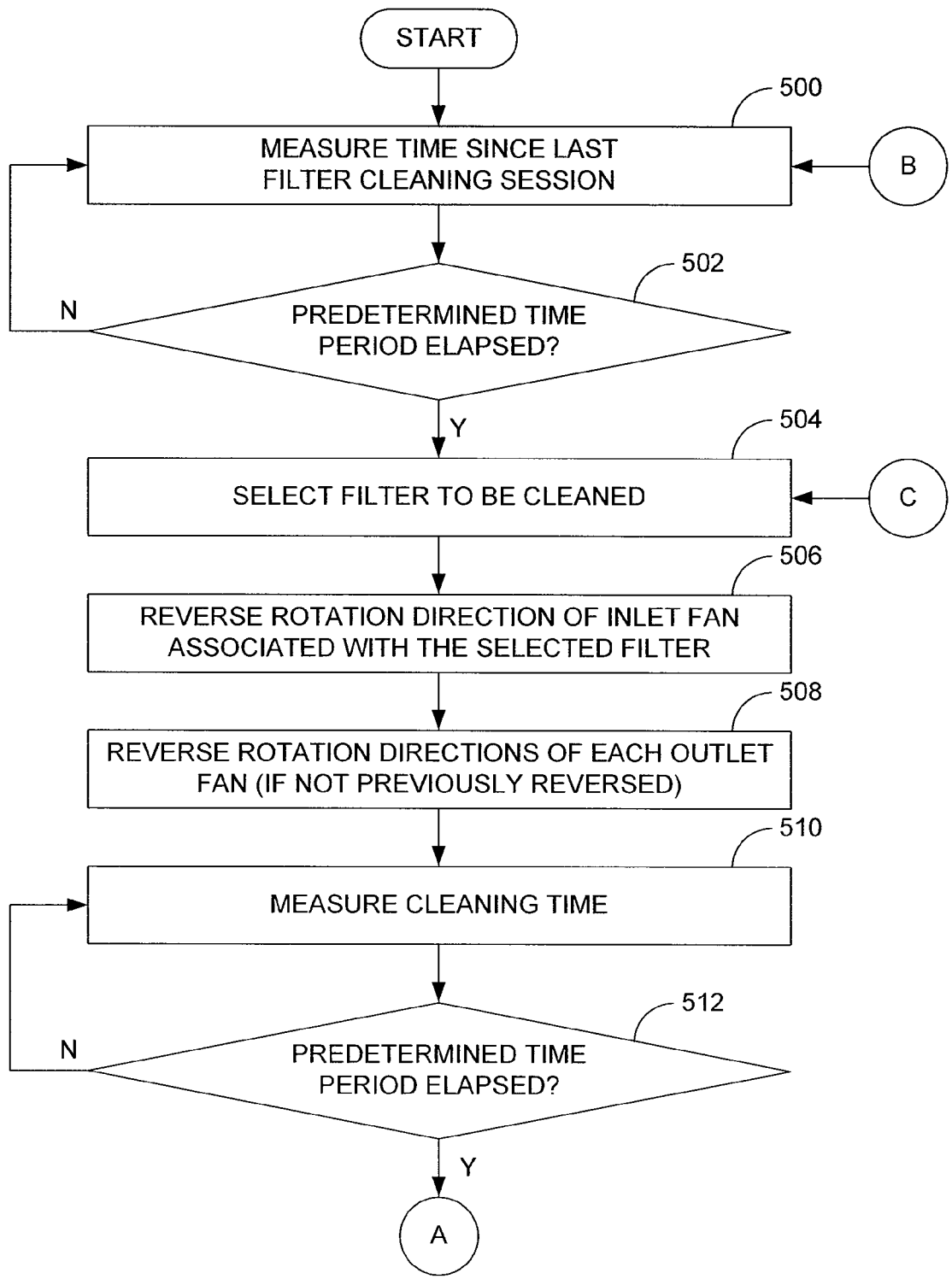
FIG. 5 is a flow diagram that illustrates a second embodiment of a method for cleaning a filter of an electrical device.
Figure 5B:
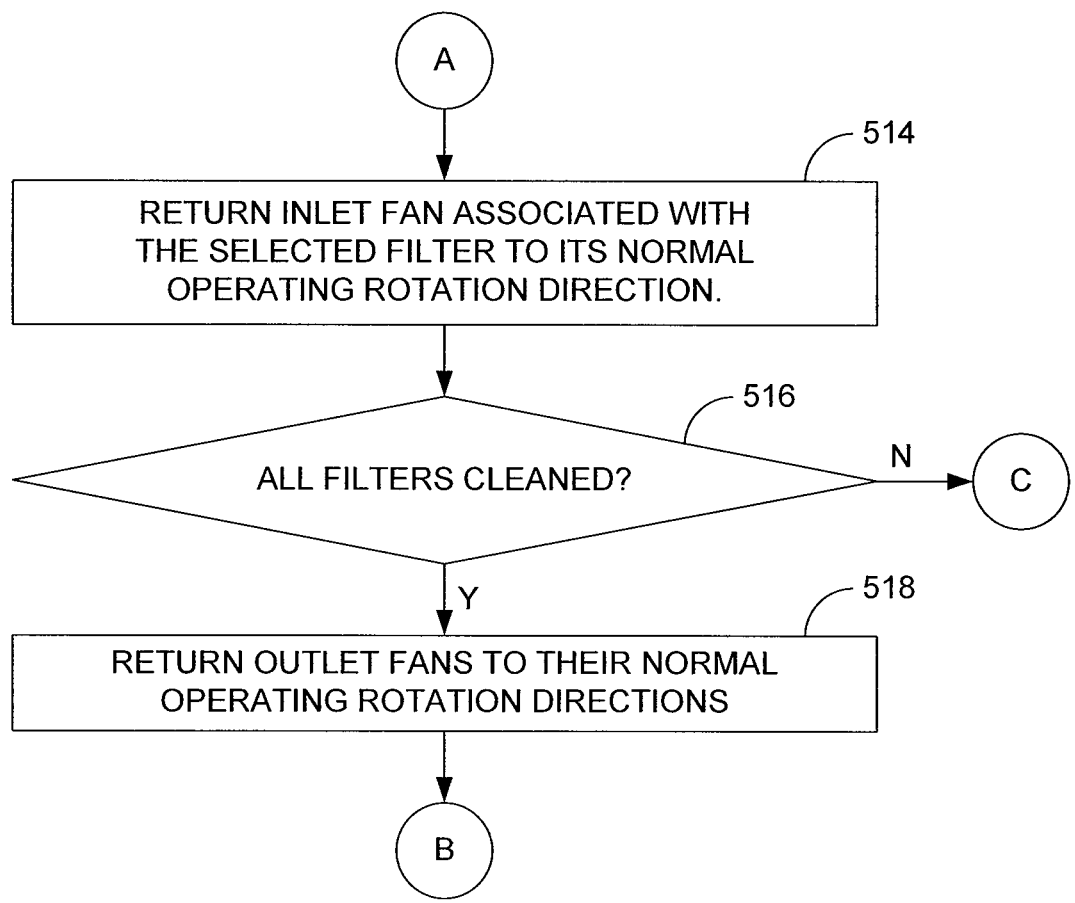

FIGS. 5A and 5B illustrate a further embodiment of a method for automatically cleaning an electrical device filter. Beginning with block 500 of FIG. 5A, the electrical device or, more particularly, the filter cleaning manager of the fan controller, measures the time since the last filter cleaning session. With reference to decision block 502, if a predetermined time period, the passage of which indicates that the filters should be cleaned, has not passed, flow returns to block 500 at which the time continues to be measured. By way of example, the predetermined time period can be a day, a week, or a month. In some embodiments, the predetermined time period can be measured relative to a particular time of day or time of the week, for example, when computing device usage is relatively low.

With further reference to decision block 502, if the predetermined time period has passed (one day, week, or month), flow continues to block 504 at which the manager selects a filter to be cleaned. For purposes of explanation, it is assumed for this example that filter A', associated with inlet fan A, is to be cleaned. Next, as indicated in block 506, the manager reverses the rotation direction of the inlet fan (e.g., fan A) and, as indicated in block 508, the rotation directions of each outlet fan (e.g., fans D-F), assuming the rotation directions of the outlet fans have not already been reversed.

At that point, the manager measures the cleaning time, as indicated in block 510. Specifically, the manager measures the time during which the rotation directions of the inlet fan and the outlet fans have been reversed. With reference to decision block 512, if a predetermined time period has not passed, flow returns to block 510 at which the time is continued to be measured. By way of example, the cleaning time can be on the order of a few minutes, for instance 1-10 minutes, or as short as a few seconds, for instance 10-20 seconds, depending on the nature of the filter and/or the environment in which it is used.

With further reference to decision block 512, if the predetermined time period has passed, flow continues to block 514 of FIG. 5B at which the manager returns the inlet fan (e.g., fan A) associated with the selected filter (e.g., filter A') to its normal operating rotation direction. With reference next to decision block 516, it is then determined whether all of the filters of the electrical device have been cleaned. If so, flow continues to block 518 at which the manager returns the outlet fans to their normal operating rotation directions. At that point, the filter cleaning session has been completed and flow may return to block 500 of FIG. 5A at which the time since the cleaning session occurred is measured. If not all of the filters have been cleaned, however, flow returns to block 504 of FIG. 5A at which the manager selects another filter to be cleaned. By way of example, the manager selects the next filter, i.e., filter B'. Flow then continues in similar manner to that described above. In keeping with the example, the rotation directions of fans B and D-F are reversed and particulate matter that has collected on or in filter B' is removed, and then the rotation directions of fans C and D-F are reversed and particulate matter that has collected on or in filter C' is removed. With such operation, each filter A'-C' is cleaned in sequence.

Figure 6:
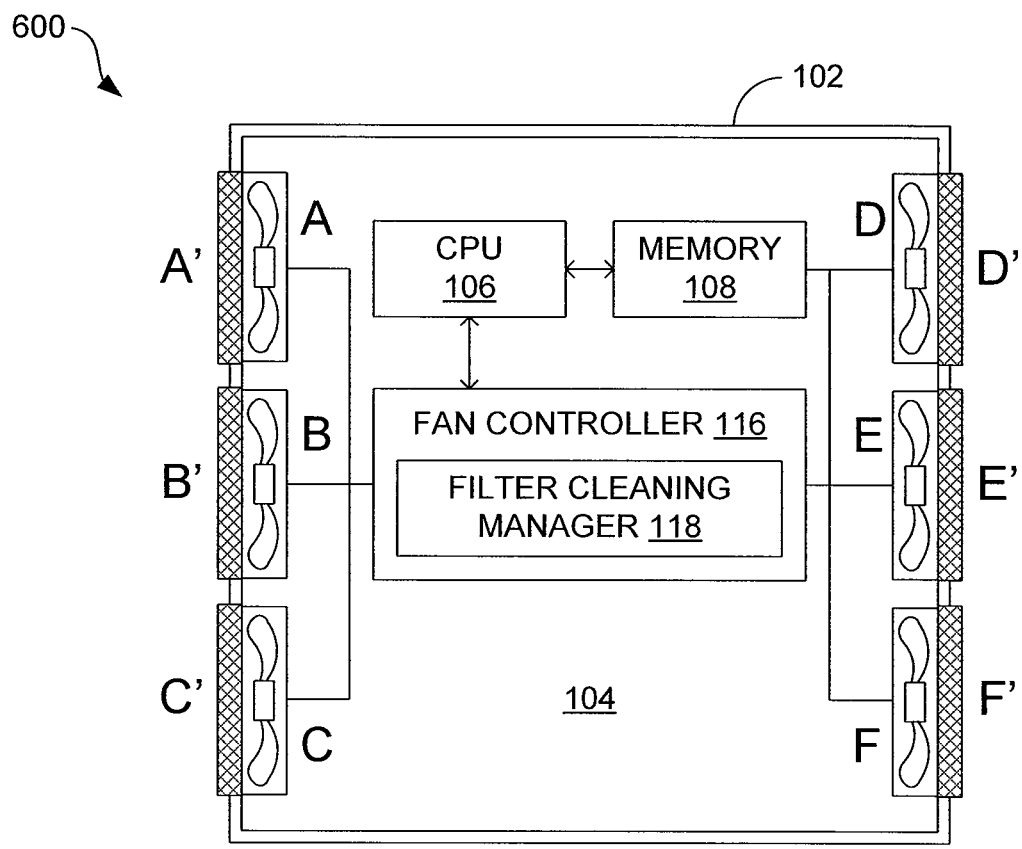
FIG. 6 is a schematic view of another embodiment of an electrical device that includes cooling fans, some of which being associated with filters.

FIG. 6 illustrates a further embodiment of an electrical device 600. As is apparent from FIG. 6, the electrical device 600 is similar in many ways to the electrical device 100 of FIG. 1 and therefore comprises many of the same components. The electrical device 600, however, includes air filters D'-F' positioned adjacent the outlet fans D-F. In such an embodiments, the filters D'-F' prevent particulate matter from entering the interior space 104 of the electrical device 600 during cleaning operations, such as those described above. Notably, given that the outlet fans D-F normally expel air from the interior space 104 during operation, automated cleaning of the filters D'-F' of the type described above may not be necessary.

What is claimed is:

1. A method for cleaning at least one filter of an electrical device, wherein the electrical device comprises a plurality of inlet fans each having a normal-operation flow direction adapted to force air into a housing of the electrical device during normal operation of the electrical device and a plurality of outlet fans each having a normal-operation flow direction adapted to draw air out of the housing of the electrical device during the normal operation of the electrical device, the method comprising:

during a filter cleaning operation, reversing the normal-operation flow direction of a first inlet fan of the plurality of inlet fans and maintaining the normal-operation flow direction of other inlet fans of the plurality of inlet fans, wherein the first inlet fan is associated with a first filter of the electrical device; and during the filter cleaning operation, reversing the normal-operation flow direction of each of the plurality of outlet fans to cause all of the plurality of outlet fans to force air into the housing so as to increase pressure within the electrical device housing during the filter cleaning operation to purge particulate matter from the first filter.

2. The method of claim 1, further comprising, after particulate matter has been purged from the first filter:

returning the first inlet fan to the normal operation flow direction, reversing the normal-operation flow direction of a second inlet fan associated with a second filter of the electrical device such that the second inlet fan is adapted to draw air out of the housing of the electrical device, wherein all of the inlet fans except the second inlet fan are controlled to force air into the electrical device housing during the filter cleaning operation such that all of the plurality of outlet fans and at least one of the plurality of inlet fans other than the second inlet fan assist the second inlet fan in purging particulate matter from the second filter.

3. The method of claim 2, further comprising, after particulate matter has been purged from the second filter:

returning the second inlet fan to the normal operation flow direction, reversing the normal-operation flow direction of a third inlet fan associated with a third filter of the electrical device such that the third inlet fan is adapted to draw air out of the housing of the electrical device, wherein all of the inlet fans except the third inlet fan are controlled to force air into the electrical device housing during the filter cleaning operation such that all of the plurality of outlet fans and at least one of the plurality of inlet fans other than the third inlet fan assist the third inlet fan in purging particulate matter from the third filter.

4. The method of claim 3, wherein the filter cleaning operation is automatically performed by the electrical device on a periodic basis such that the plurality of filters are periodically and sequentially cleaned.

5. A method for cleaning air filters of an electrical device, the electrical device including multiple inlet fans each having a normal-operation flow direction that forces air into an interior space of the electrical device during normal operation of the electrical device, an air filter associated with each of the inlet fans that is configured to prevent particulate matter from entering the interior space, and multiple outlet fans each having a normal-operation flow direction that draws air out from the interior space during normal operation of the electrical device, the method comprising:

during a filter cleaning operation, sequentially cleaning each of the air filters by sequentially reversing the normal-operation flow direction of a single inlet fan and maintaining the normal-operation flow direction of other inlet fans such that the single inlet fan purges particulate matter from its associated air filter; and during the filter cleaning operation, reversing the normal-operation flow direction of each of the outlet fans so as to increase the pressure within the interior space and thereby assist the single inlet fan in purging particulate matter from its associated air filter.

6. The method of claim 5, further comprising repeating the filter cleaning operation on a periodic basis.

7. The method of claim 6, wherein sequentially cleaning each of the air filters by sequentially reversing the normal-operation flow direction of a single inlet fan comprises:

during the filter cleaning operation, reversing the normal-operation flow direction of a first one of the inlet fans such that the first inlet fan purges particulate matter from its associated filter;

returning the first inlet fan to the normal operation flow direction after a predetermined time period has elapsed;

determining whether all of the air filters of the inlet fans have been cleaned; and if not all of the air filters have been cleaned, selecting a second one of the inlet fans and reversing the normal-operation flow direction of the second inlet fan such that the second inlet fan purges particulate matter from its associated air filter.

8. The method of claim 5, wherein each of the outlet fans includes an air filter positioned adjacent thereto.

9. The method of claim 1, wherein each of the plurality of outlet fans includes a filter positioned adjacent thereto.

10. A method for cleaning air filters of an electrical device, the electrical device including a plurality of inlet fans each having a normal-operation rotation direction that forces air into an interior space of the electrical device during normal operation of the electrical device, each of the plurality of inlet fans associated with one of the air filters, and a plurality of outlet fans each having a normal-operation rotation direction that draws air out from the interior space during normal operation of the electrical device, the method for cleaning the air filters comprising:

selecting a first one of the air filters to be cleaned;

reversing the normal-operation rotation direction of a first inlet fan of the plurality of inlet fans associated with the selected first one of the air filters, and maintaining the normal-operation rotation direction of other inlet fans of the plurality of inlet fans;

reversing the normal-operation rotation direction of each of the plurality of outlet fans to cause all of the plurality of outlet fans to force air into the interior space of the electrical device;

returning the first inlet fan to the normal-operation rotation direction after a predetermined period of time has elapsed to cause the first inlet fan to force air into the interior space of the electrical device;

determining whether each of the air filters has been cleaned;

if each of the air filters has not been cleaned, selecting a second one of the air filters to be cleaned and repeating the reversing, returning, and determining steps above for cleaning the selected second one of the air filters; and if each of the filters has been cleaned, returning each of the plurality of outlet fans to the normal-operation rotation direction to cause the plurality of outlet fans to draw air out of the interior space of the electrical device.

11. The method of claim 10, further comprising:
prior to returning the first inlet fan to the normal-operation rotation direction, measuring a duration of time during which the normal-operation rotation direction of the first inlet fan has been reversed.

* * * * *